United States Patent
An et al.

(10) Patent No.: US 12,306,595 B1
(45) Date of Patent: May 20, 2025

(54) LASER PACKAGING SYSTEM AND INTELLIGENT HEAT DISSIPATION METHOD THEREOF

(71) Applicants: Dongguan Pepper Gray Technology Co., Ltd., Guangdong (CN); Shenzhen Pepper Gray Technology Co., Ltd., Guangdong (CN)

(72) Inventors: Yi An, Guangdong (CN); Qi Chen, Guangdong (CN); Taimeng Qin, Guangdong (CN); Wei Chen, Guangdong (CN)

(73) Assignees: Dongguan Pepper Gray Technology Co., Ltd., Dongguan (CN); Shenzhen Pepper Gray Technology Co., Ltd., Shenzhen (CN)

( * ) Notice: Subject to any disclaimer, the term of this patent is extended or adjusted under 35 U.S.C. 154(b) by 0 days.

(21) Appl. No.: 18/987,438

(22) Filed: Dec. 19, 2024

Related U.S. Application Data

(63) Continuation of application No. PCT/CN2024/121780, filed on Sep. 27, 2024.

(30) Foreign Application Priority Data

Dec. 26, 2023 (CN) .......................... 202311805897.0

(51) Int. Cl.
G05B 13/02 (2006.01)
H01S 5/024 (2006.01)

(52) U.S. Cl.
CPC ........ *G05B 13/027* (2013.01); *H01S 5/02423* (2013.01); *H01S 5/02469* (2013.01)

(58) Field of Classification Search
None
See application file for complete search history.

(56) References Cited

U.S. PATENT DOCUMENTS

| | | |
|---|---|---|
| 2005/0200311 A1 | 9/2005 | Youle |
| 2017/0262772 A1* | 9/2017 | Takigawa ............ H01S 5/02423 |
| | (Continued) | |

FOREIGN PATENT DOCUMENTS

| | | |
|---|---|---|
| CN | 1492551 A | 4/2004 |
| CN | 103094818 A | 5/2013 |
| | (Continued) | |

*Primary Examiner* — David Earl Ogg

(57) ABSTRACT

The present disclosure provides a laser packaging system and an intelligent heat dissipation method thereof. The system includes: a laser array module having a plurality of lasers arranged at intervals, each laser having a heat sink, and the heat sink being provided with a TEC semiconductor refrigerator; a training module configured to train and verify a deep learning model based on a measured temperature of the laser and historical operating state data within a specific time period so as to output the trained deep learning model; a prediction module configured to input a first parameter and a second parameter of the detected laser into the trained deep learning model to generate a predicted temperature, wherein the first parameter includes power, and the second parameter includes running time; and a temperature adjusting module configured to control the TEC semiconductor refrigerator to adjust temperature of the laser based on the predicted temperature.

12 Claims, 5 Drawing Sheets

(56) References Cited

U.S. PATENT DOCUMENTS

| | | | | |
|---|---|---|---|---|
| 2022/0140566 A1* | 5/2022 | Reill | ............... | H01S 5/0233 |
| | | | | 372/43.01 |
| 2023/0001518 A1* | 1/2023 | Ohmori | ............... | B23K 26/705 |
| 2023/0067275 A1* | 3/2023 | Gupta | ............... | H01S 5/4025 |

FOREIGN PATENT DOCUMENTS

| | | | |
|---|---|---|---|
| CN | 110365473 | A | 10/2019 |
| CN | 112487722 | A | 3/2021 |
| CN | 113486544 | A | 10/2021 |
| CN | 114184296 | A | 3/2022 |
| CN | 115249941 | A | 10/2022 |
| CN | 115864102 | A | 3/2023 |
| CN | 116780316 | A | 9/2023 |
| CN | 117010189 | A | 11/2023 |
| CN | 117111649 | A | 11/2023 |
| CN | 117273082 | A | 12/2023 |
| WO | 2023228637 | A1 | 11/2023 |

\* cited by examiner

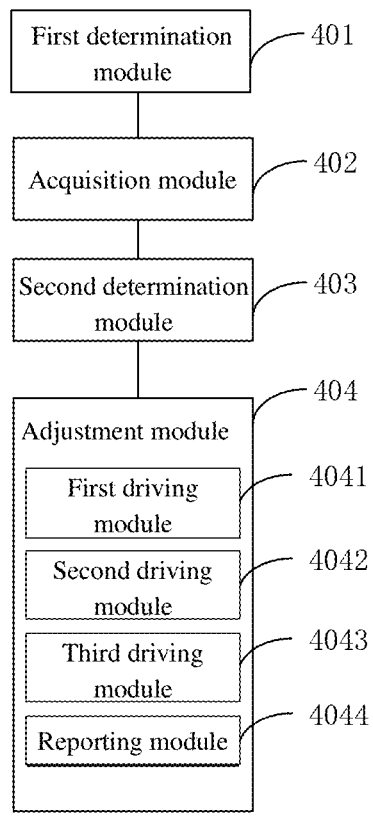

FIG. 6

Acquiring a measured temperature of the laser within a specific time period and historical operating state data at a corresponding moment to generate a database, and dividing the database into training data and verification data; training a deep learning model based on the training data, and verifying the trained deep learning model based on the verification data; if a difference between a predicted temperature output by the verification and a corresponding measured temperature is within a first preset interval, outputting the trained deep learning model; — S1

Detecting a first parameter and a second parameter of the laser in real time and inputting the first parameter and the second parameter into the trained deep learning model so as to generate a predicted temperature corresponding to the laser; wherein the first parameter includes power, and the second parameter includes running time; — S2

Controlling the TEC semiconductor refrigerator to adjust a current temperature of the laser based on the predicted temperature. — S3

FIG. 7

LASER PACKAGING SYSTEM AND INTELLIGENT HEAT DISSIPATION METHOD THEREOF

CROSS-REFERENCE TO RELATED APPLICATIONS

This application is a bypass continuation application of PCT application no.: PCT/CN2024/121780. This application claims priorities from PCT Application PCT/CN2024/121780, filed Sep. 27, 2024, and from Chinese patent application 202311805897.0, filed Dec. 26, 2023, the contents of which are incorporated herein in the entirety by reference.

TECHNICAL FIELD

The present disclosure relates to the technical field of laser packaging, and in particular, to a laser packaging system and an intelligent heat dissipation method thereof.

BACKGROUND

A semiconductor laser array is also called a laser diode bar, or a bar for short. Based on the power requirements, a few to nearly a thousand laser diodes are grown on the same substrate using metal organic chemical vapor deposition (MOCVD) to form a one-dimensional array. If a multi-element array is divided into groups, each with 19 units as a unit, the groups are separated by an optical isolation technology, the light emitted by the groups is independent of each other to form multi-aperture lasing, and an output power can be increased by increasing the number of integration. However, the semiconductor laser array has a high power and an increased temperature when working for a long time. With the increase of a junction temperature, the semiconductor laser array has a broadened wavelength, an increased threshold current, and a decreased photoelectric conversion efficiency; consequently, the service life is shortened, and the reliability is reduced. Therefore, semiconductor laser packaging and heat dissipation technology are particularly important.

Currently, a large number of sensors are arranged in a semiconductor laser array to detect the temperature rise of the laser. The large number of sensors increases the difficulty of laser packaging, and the arrangement of the large number of sensors also increases the packaging cost.

In addition, the existing semiconductor laser array achieves uses heat dissipation by water cooling, but a small-size water-cooling module has a poor heat dissipation effect, which seriously affects the normal working of the semiconductor laser array; and a large-size water-cooling module has great difficulties in packaging and is not conducive to the use of the semiconductor laser array. Further, the water-cooling module also has risks such as microleakage and water leakage, which has low safety and reliability. Once the water-cooling module stops working, the entire semiconductor laser array stops working.

SUMMARY

To overcome the above defects in the prior art, the present disclosure provides a laser packaging system and a heat dissipation method thereof.

The specific technical solutions are as follows:

A laser packaging system includes:

a laser array module, having a plurality of lasers arranged at intervals and distributed in an array, each of the lasers having a heat sink for conducting heat, and each heat sink being provided with a TEC semiconductor refrigerator for dissipating heat from the laser;

a training module, configured to acquire a measured temperature of the laser within a specific time period and historical operating state data at a corresponding moment to generate a database, and divide the database into training data and verification data; train a deep learning model based on the training data, and verify the trained deep learning model based on the verification data; if a difference between a predicted temperature output by the verification and a corresponding measured temperature is within a first preset interval, output the trained deep learning model;

a prediction module, configured to detect a first parameter and a second parameter of the laser in real time and input the first parameter and the second parameter into the trained deep learning model so as to generate a predicted temperature corresponding to the laser; wherein the first parameter includes power, and the second parameter includes running time; and a temperature adjusting module, configured to control the TEC semiconductor refrigerator to adjust a current temperature of the laser based on the predicted temperature.

In a specific embodiment, the plurality of lasers include a plurality of first lasers and a plurality of second lasers, with at least two second lasers between every two adjacent first lasers;

the system further includes: a distribution module, configured to determine a measured temperature rise of the laser based on the measured temperature of the laser within a specific time period, if the measured temperature rise exceeds a second preset interval, taking the laser as the first laser, and if the measured temperature rise is in a second preset interval, taking the laser as the second laser;

wherein the first laser is separately provided with one TEC semiconductor refrigerator, and at least two second lasers share one TEC semiconductor refrigerator.

In a specific embodiment, the laser packaging system further includes:

a temperature sensor, configured to acquire a measured temperature of the laser at a preset moment;

a calculation module, configured to calculate a difference between the measured temperature of the laser at the preset moment and a predicted temperature according to the measured temperature and the predicted temperature; and an optimization module, configured to judge whether a difference between the measured temperature and the predicted temperature is in a third preset interval, if a difference between the measured temperature and the predicted temperature exceeds a third preset interval, record the measured temperature of the laser and the historical operating state data at a corresponding moment so as to update a database, and optimize the deep learning model according to the updated database.

In a specific embodiment, a plurality of temperature sensors are provided, and the plurality of temperature sensors are distributed in a distance range from 15% to 80% of a distance from a center to an edge of the laser array module; and the number of the temperature sensors is gradually decreased in a direction from the center to the edge of the laser array module.

In a specific embodiment, the laser packaging system further includes:
- a liquid cooling module, wherein the liquid cooling module is arranged on one side of the laser close to the heat sink, and the liquid cooling module and the TEC semiconductor refrigerator are arranged in parallel or in a stacked mode; and
- a power module, configured to drive the liquid cooling module to increase a circulating power when the power of the TEC semiconductor refrigerator is less than a threshold.

In a specific embodiment, the first parameter further includes resistance, resonant frequency, emission wavelength, or threshold current; the second parameter further includes an area of the heat sink; the historical operating state data includes resistance, resonant frequency, emission wavelength, threshold current, or operating time of the laser; and/or, the temperature adjusting module includes:
- a first determination module, configured to determine a predicted temperature rise of the laser within a specific time period based on the predicted temperature;
- an acquisition module, configured to acquire the number of the predicted temperature rises based on the same TEC semiconductor refrigerator at the same moment;
- a second determination module configured to, if there are a plurality of the predicted temperature rises, take a maximum predicted temperature rise as a final predicted temperature rise for adjusting a temperature of the TEC semiconductor refrigerator; and if there is one predicted temperature rise, take the predicted temperature rise as a final predicted temperature rise for adjusting a temperature of the TEC semiconductor refrigerator; and
- an adjusting module, configured to control the TEC semiconductor refrigerator to adjust a current temperature of the laser based on a final predicted temperature rise;

and/or, the adjusting module includes:
- a first driving module configured to, when the final predicted temperature rise is in a first temperature rise range, drive the TEC semiconductor refrigerator to work at 25% of the maximum power to restore the temperature of the laser;
- a second driving module configured to, when the final predicted temperature rise is in a second temperature rise range, drive the TEC semiconductor refrigerator to work at 50% of the maximum power to restore the temperature of the laser;
- a third driving module configured to, when the final predicted temperature rise is in a third temperature rise range, drive the TEC semiconductor refrigerator to work at 75% of the maximum power to restore the temperature of the laser; and
- a reporting module configured to, when the final predicted temperature rise exceeds a third temperature rise range, detect a current measured temperature of the laser and acquire current operation state data, and update the measured temperature and the current operation state data to a database.

An intelligent heat dissipation method applied to the laser packaging system includes:
- acquiring a measured temperature of the laser within a specific time period and historical operating state data at a corresponding moment to generate a database, and dividing the database into training data and verification data; training a deep learning model based on the training data, and verifying the trained deep learning model based on the verification data; if a difference between a predicted temperature output by the verification and a corresponding measured temperature is within a first preset interval, outputting the trained deep learning model;
- detecting a first parameter and a second parameter of the laser in real time and inputting the first parameter and the second parameter into the trained deep learning model so as to generate a predicted temperature corresponding to the laser; wherein the first parameter includes power, and the second parameter includes running time; and
- controlling the TEC semiconductor refrigerator to adjust a current temperature of the laser based on the predicted temperature.

In a specific embodiment, the intelligent heat dissipation method further includes:
- acquiring a measured temperature of the laser at a preset moment;
- calculating a difference between the measured temperature of the laser at the preset moment and a predicted temperature according to the measured temperature and the predicted temperature; and
- judging whether a difference between the measured temperature and the predicted temperature is in a third preset interval, if a difference between the measured temperature and the predicted temperature exceeds a third preset interval, recording the measured temperature of the laser and working state data at a corresponding moment so as to update a database, and optimizing the deep learning model according to the updated database.

In a specific embodiment, the "controlling the TEC semiconductor refrigerator to adjust a current temperature of the laser based on the predicted temperature" includes:
- determining a predicted temperature rise of the laser within a specific time period based on the predicted temperature;
- acquiring the number of the predicted temperature rises based on the same TEC semiconductor refrigerator at the same moment;
- if there are a plurality of the predicted temperature rises, taking a maximum predicted temperature rise as a final predicted temperature rise for adjusting a temperature of the TEC semiconductor refrigerator; and if there is one predicted temperature rise, taking the predicted temperature rise as a final predicted temperature rise for adjusting a temperature of the TEC semiconductor refrigerator; and
- controlling the TEC semiconductor refrigerator to adjust a current temperature of the laser based on a final predicted temperature rise.

In a specific embodiment, the "controlling the TEC semiconductor refrigerator to adjust a current temperature of the laser based on a final predicted temperature rise" includes:
- when the final predicted temperature rise is in a first temperature rise range, driving the TEC semiconductor refrigerator to work at 25% of the maximum power to restore the temperature of the laser;
- when the final predicted temperature rise is in a second temperature rise range, driving the TEC semiconductor refrigerator to work at 50% of the maximum power to restore the temperature of the laser;
- when the final predicted temperature rise is in a third temperature rise range, driving the TEC semiconductor refrigerator to work at 75% of the maximum power to restore the temperature of the laser; and when the final predicted temperature rise exceeds a third temperature rise range, detecting a current measured temperature of the laser and acquiring current operation state data, and updating the measured temperature and the current operation state data to a database.

The present disclosure has at least the following beneficial effects:

The present disclosure provides a laser packaging system and an intelligent heat dissipation method thereof. The system includes: a laser array module, having a plurality of lasers arranged at intervals and distributed in an array, each of the lasers having a heat sink for conducting heat, and each heat sink being provided with a TEC semiconductor refrigerator for dissipating heat from the laser; a training module, configured to acquire a measured temperature of the laser within a specific time period and historical operating state data at a corresponding moment to generate a database, and divide the database into training data and verification data; train a deep learning model based on the training data, and verify the trained deep learning model based on the verification data; if a difference between a predicted temperature output by the verification and a corresponding measured temperature is within a first preset interval, output the trained deep learning model; a prediction module, configured to detect a first parameter and a second parameter of the laser in real time and input the first parameter and the second parameter into the trained deep learning model so as to generate a predicted temperature corresponding to the laser; wherein the first parameter includes power, and the second parameter includes running time; and a temperature adjusting module, configured to control the TEC semiconductor refrigerator to adjust a current temperature of the laser based on the predicted temperature. According to the present disclosure, the laser is cooled by the TEC semiconductor refrigerator, so that the potential safety hazards of micro leakage and water leakage in water cooling in the prior art are solved, and the system is safer and more reliable; and by combining the training module and the prediction module, the predicted temperature of the laser is predicted through a deep learning model, thereby replacing the detection of traditional temperature sensors. The entire system structure is relatively simple, and there is no need to provide too many sensors, which greatly reduces the packaging difficulty and packaging cost, while also having a good heat dissipation effect.

Further, the plurality of lasers include a plurality of first lasers and a plurality of second lasers, with at least two second lasers between every two adjacent first lasers; the system further includes: a distribution module, configured to determine a measured temperature rise of the laser based on the measured temperature of the laser within a specific time period, if the measured temperature rise exceeds a second preset interval, taking the laser as the first laser, and if the measured temperature rise is in a second preset interval, taking the laser as the second laser; wherein the first laser is separately provided with one TEC semiconductor refrigerator, and at least two second lasers share one TEC semiconductor refrigerator. According to the present disclosure, the first laser and the second laser are distinguished through the measured temperature rise of the lasers. The first laser generates more heat, and therefore, one TEC semiconductor refrigerator needs to be separately provided for heat dissipation. The second laser generates less heat, and therefore, at least two adjacent lasers can be arranged on the same TEC semiconductor refrigerator for heat dissipation. This design not only reduces the number of TEC semiconductor refrigerators and reduces production costs, but also has a good heat dissipation effect, making the heat dissipation more uniform and efficient.

Further, the present disclosure further includes: a temperature sensor, configured to acquire a measured temperature of the laser at a preset moment; a calculation module, configured to calculate a difference between the measured temperature of the laser at the preset moment and a predicted temperature according to the measured temperature and the predicted temperature; and an optimization module, configured to judge whether a difference between the measured temperature and the predicted temperature is in a third preset interval, if a difference between the measured temperature and the predicted temperature exceeds a third preset interval, record the measured temperature of the laser and the historical operating state data at a corresponding moment so as to update a database, and optimize the deep learning model according to the updated database. According to the present disclosure, the temperature sensor is used to verify the predicted temperature of the prediction module in real time, so that the deep learning model can be optimized in time, the reliability of the predicted temperature in the system is improved, the deviation between the predicted temperature and the actual temperature is reduced, and the reliability of the entire system is significantly improved.

BRIEF DESCRIPTION OF DRAWINGS

To describe technical solutions in embodiments of the present disclosure more clearly, the following briefly describes the accompanying drawings required for describing embodiments. Apparently, the accompanying drawings in the following descriptions show merely some embodiments of the present disclosure, and those of ordinary skill in the art may still derive other accompanying drawings from these accompanying drawings without creative efforts.

FIG. 6 is a third schematic diagram of a system according to Embodiment 1;

FIG. 7 is a flowchart of an intelligent heat dissipation method according to Embodiment 2.

REFERENCE NUMERALS

1: laser array module; 2: training module; 3: prediction module; 4: temperature adjusting module;
5: distribution module; 6: temperature sensor; 7: calculation module; 8: optimization module;
9: liquid cooling module; 10: power module; 11: placement area;
101: laser, 102: heat sink, 103: TEC semiconductor refrigerator;
1011: first laser, 1012: second laser;
401: first determination module; 402: acquisition module; 403: second determination module; 404: adjusting module;

4041: first driving module; 4042: second driving module; 4043: third driving module; and 4044: reporting module.

DETAILED DESCRIPTION OF EMBODIMENTS

The following clearly and completely describes the technical solutions in the embodiments of the present disclosure with reference to the accompanying drawings in the embodiments of the present disclosure. Apparently, the described embodiments are only a part rather than all of the embodiments of the present disclosure. All other embodiments obtained by those of ordinary skill in the art based on embodiments of the present disclosure without creative efforts shall fall within the protection scope of the present disclosure.

Embodiment 1

Figure 1:
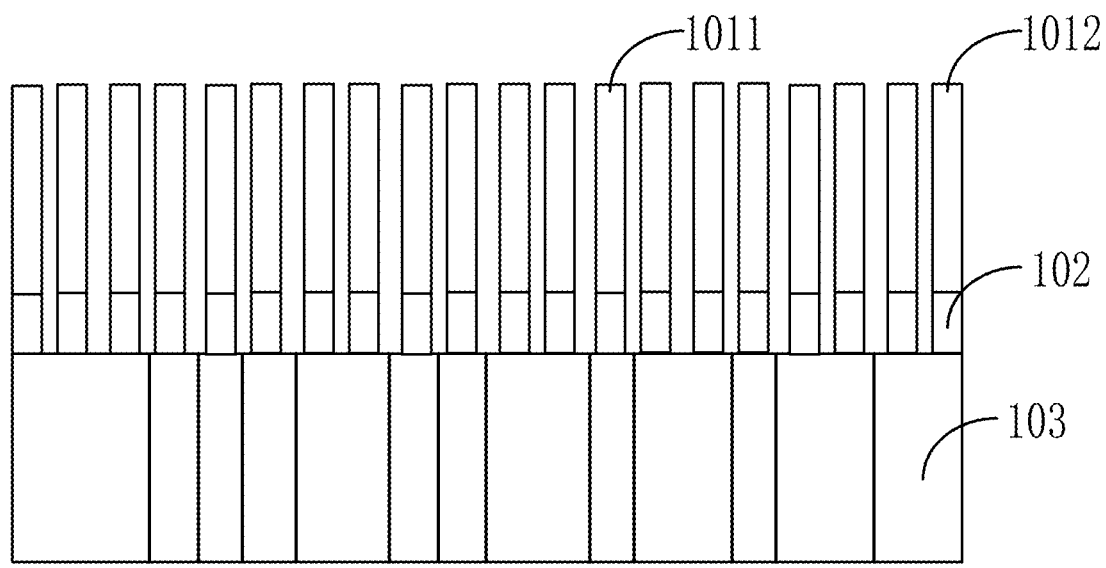
FIG. 1 is a schematic diagram of a laser array module according to Embodiment 1.

As shown in FIG. 1, the present disclosure provides a packaging system of a laser 101 and an intelligent heat dissipation method thereof. The system includes: a laser array module 1, having a plurality of lasers 101 arranged at intervals and distributed in an array, each of the lasers 101 having a heat sink 102 for conducting heat, and each heat sink 102 being provided with a TEC semiconductor refrigerator 103 for dissipating heat from the laser 101; a training module 2, configured to acquire a measured temperature of the laser 101 within a specific time period and historical operating state data at a corresponding moment to generate a database, and divide the database into training data and verification data; train a deep learning model based on the training data, and verify the trained deep learning model based on the verification data; if a difference between a predicted temperature output by the verification and a corresponding measured temperature is within a first preset interval, output the trained deep learning model; a prediction module 3, configured to detect a first parameter and a second parameter of the laser 101 in real time and input the first parameter and the second parameter into the trained deep learning model so as to generate a predicted temperature corresponding to the laser 101; wherein the first parameter includes power, and the second parameter includes running time; and a temperature adjusting module 4, configured to control the TEC semiconductor refrigerator 103 to adjust a current temperature of the laser 101 based on the predicted temperature.

According to the present disclosure, the laser 101 is cooled by the TEC semiconductor refrigerator 103, so that the problem of large volume and inconvenience in using water cooling for heat dissipation in the prior art and the potential safety hazards of micro leakage and water leakage in using water cooling are solved, and the system is safer and more reliable; and by combining the training module 2 and the prediction module 3, the predicted temperature of the laser 101 is predicted through a deep learning model, thereby replacing the detection of traditional temperature sensors 6. The entire system structure is relatively simple, and there is no need to provide too many sensors, which greatly reduces the packaging difficulty and packaging cost. Meanwhile, this system has a good heat dissipation effect, so that the laser array module 1 has a good photoelectric conversion rate, and the service life of the laser array module 1 is prolonged.

Figure 2:
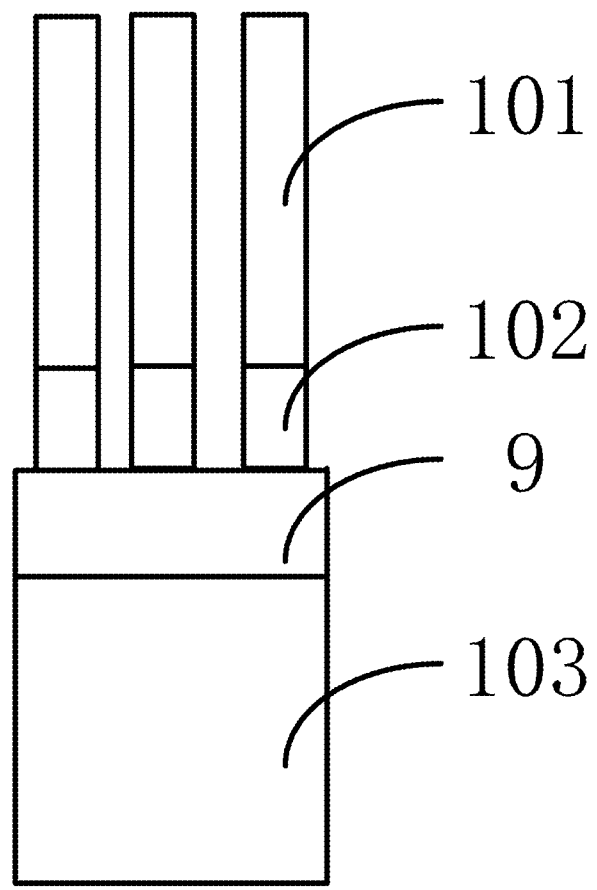
FIG. 2 is a first schematic diagram of a laser according to Embodiment 1.
Figure 3:
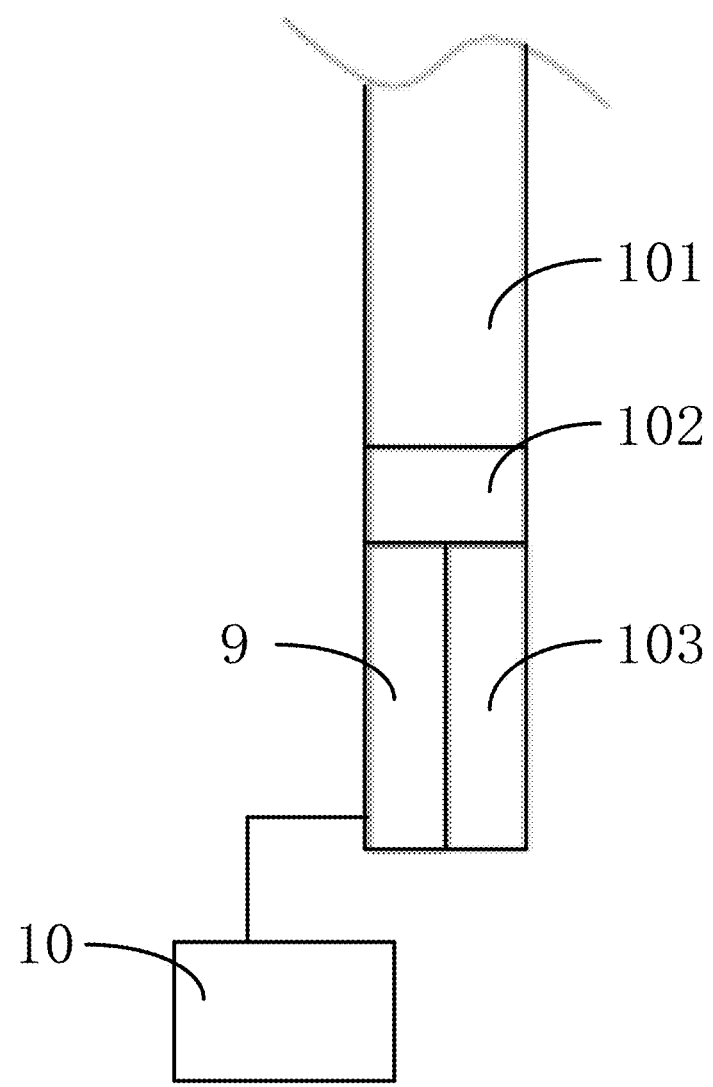
FIG. 3 is a second schematic diagram of a laser according to Embodiment 1.

As shown in FIGS. 1 to 3, for a plurality of lasers 101 in the present disclosure, a plurality of lasers 101 of different types or a plurality of lasers 101 of the same type may be used based on a requirement. Different types of lasers 101 correspond to different powers.

In one embodiment, the plurality of lasers 101 are all of the same type, each laser 101 has a heat sink 102, and each heat sink 102 is correspondingly provided with a TEC semiconductor refrigerator 103. That is to say, one laser 101 is separately provided with one TEC semiconductor refrigerator 103, and the temperature rise of each laser 101 can be adjusted by driving each TEC semiconductor refrigerator 103 to work, so that the temperature adjustment is more accurate, and the heat dissipation effect is better.

In another embodiment, the plurality of lasers 101 are of different types, a part of the lasers 101 share one TEC semiconductor refrigerator 103, and the other part of the lasers 101 are separately provided with one TEC semiconductor refrigerator 103, so that the use of the TEC semiconductor refrigerators 103 can be reduced, and the required cost can be reduced.

Figure 4:
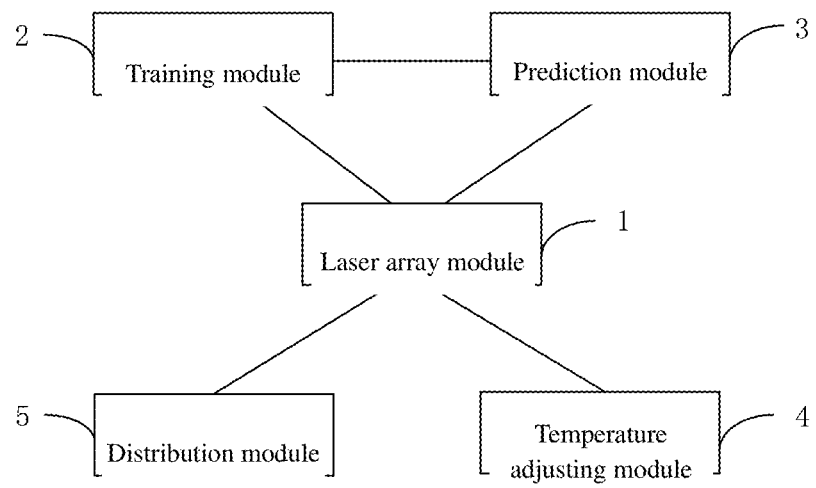
FIG. 4 is a first schematic diagram of a system according to Embodiment 1.

In addition to dividing different lasers 101 based on the type of the laser 101, it is also possible to distinguish different lasers 101 based on the temperature rise change of the laser 101, specifically:

as shown in FIGS. 1 and 4, the plurality of lasers 101 includes a plurality of first lasers 1011 and a plurality of second lasers 1012, with at least two second lasers 1012 between every two adjacent first lasers 1011;

the system further includes: a distribution module 5, configured to determine a measured temperature rise of the laser 101 based on the measured temperature of the laser 101 within a specific time period, if the measured temperature rise exceeds a second preset interval, taking the laser 101 as the first laser 1011, and if the measured temperature rise is in a second preset interval, taking the laser 101 as the second laser 1012; and the first laser 1011 is separately provided with one TEC semiconductor refrigerator 103, and at least two second lasers 1012 share one TEC semiconductor refrigerator 103.

According to the present disclosure, the first laser 1011 and the second laser 1012 are distinguished through the measured temperature rise of the laser 101. The first laser 1011 is a laser 101 that generates more heat, and therefore, one TEC semiconductor refrigerator 103 needs to be separately provided for heat dissipation. The second laser 1012 is a laser 101 that generates less heat, and therefore, at least two adjacent lasers 101 can be arranged on the same TEC semiconductor refrigerator 103 for heat dissipation. This design not only reduces the number of TEC semiconductor refrigerators 103 and reduces production costs, but also has a good heat dissipation effect, making the heat dissipation more uniform and efficient.

Figure 5:
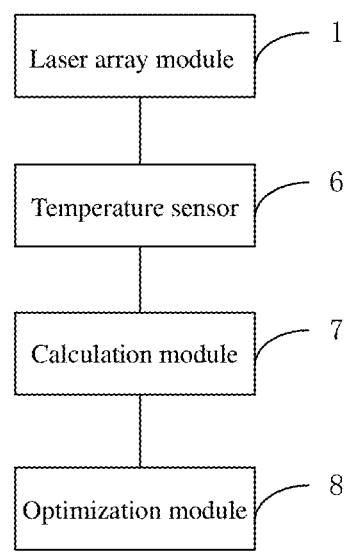
FIG. 5 is a second schematic diagram of a system according to Embodiment 1.

As shown in FIG. 5, the present disclosure further includes:

a temperature sensor 6, configured to acquire a measured temperature of the laser 101 at a preset moment;

a calculation module 7, configured to calculate a difference between the measured temperature of the laser 101 at the preset moment and a predicted temperature according to the measured temperature and the predicted temperature; and an optimization module 8, configured to judge whether a difference between the measured temperature and the predicted temperature is in a third preset interval, if a difference between the measured temperature and the predicted temperature exceeds a third preset interval, record the measured temperature of the laser 101 and the historical operating state data at a corresponding moment so as to update a database, and optimize the deep learning model according to the updated database.

The function of the temperature sensor 6 of the present disclosure is different from that of the prior art, which is used for temperature measuring to adjust the temperature of the laser 101. In the present disclosure, the temperature sensor 6 only verifies a predicted temperature of a prediction module 3, if the difference between the measured temperature and the predicted temperature is in a third preset interval, the predicted temperature can be continuously adopted to adjust the temperature of the laser 101; and if the difference between the measured temperature and the predicted temperature exceeds a third preset interval, the measured temperature of the laser 101 and the working state data at a corresponding moment need to be recorded to update a database, and a deep learning model is optimized according to the updated database. With the combination of the temperature sensor 6, the calculation module 7 and the optimization module 8, the optimization of the deep learning model is achieved, the reliability of the predicted temperature in the system is improved, the deviation between the predicted temperature and the actual temperature is reduced, and the reliability of the entire system is significantly improved.

As shown in FIGS. 1 to 6, one or more temperature sensor 6 may be provided.

If only one temperature sensor 6 is provided, preferably, the temperature sensor 6 is arranged at a center of the laser array module 1 or at a maximum heating area of the laser array module 1.

Figure 8:
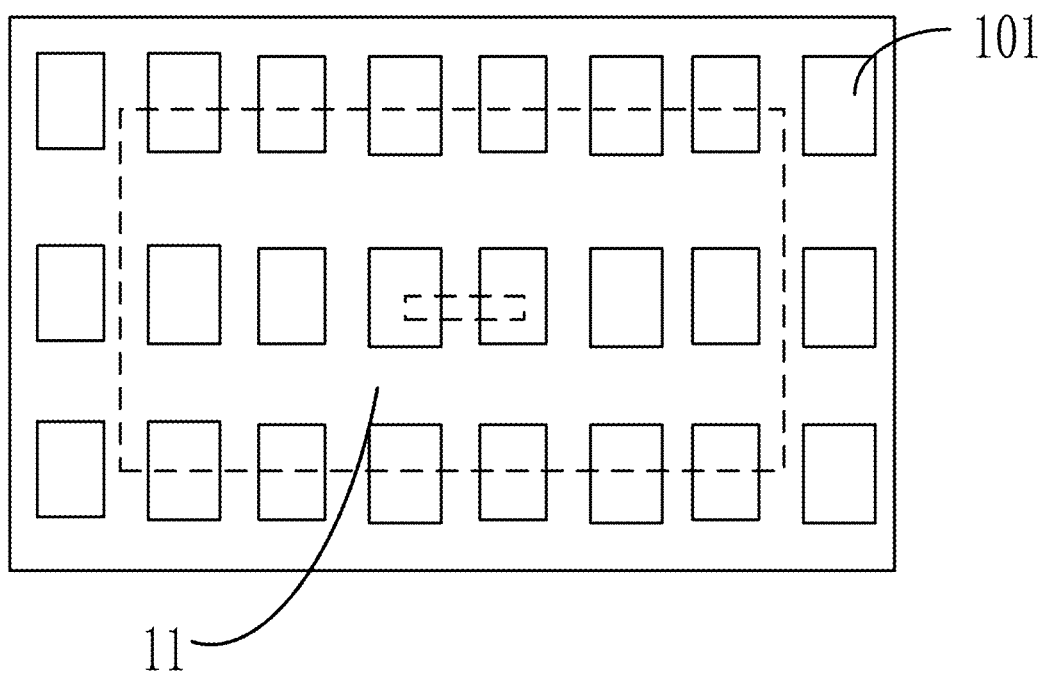
FIG. 8 is a schematic diagram of distribution of temperature sensors according to Embodiment 1.

As shown in FIG. 8, when a plurality of temperature sensors 6 are provided, the plurality of temperature sensors 6 are distributed in a distance range from 15% to 80% of a distance from a center to an edge of the laser array module 1; and the number of the temperature sensors 6 is gradually decreased in a direction from the center to the edge of the laser array module 1.

Specifically, for an array of lasers 101, the laser 101 closer to the center generates more heat, and the temperature rise of the laser is more varied, so that the TEC semiconductor refrigerator 103 needs to be driven more precisely and more timely to adjust the temperature of the laser 101 in the middle area. When the temperature sensor 6 is provided in the present disclosure, the plurality of temperature sensors 6 are distributed in a distance range from 15% to 80% of a distance from a center to an edge of the laser array module 1, so that the temperature sensors 6 can determine the difference between the predicted temperature and the measured temperature of the laser 101 in the middle area in time, therefore, the information of the predicted temperature anomaly can be acquired in time, the deep learning model can be optimized in time, and the accuracy and the reliability of the predicted data are ensured (wherein a distance range from 15% to 80% of a distance from a center to an edge of the laser array module 1 is a placement area 11 shown in FIG. 8).

As shown in FIG. 3, the present disclosure further includes:
a liquid cooling module 9, wherein the liquid cooling module 9 is arranged on one side of the laser 101 close to the heat sink 102, and the liquid cooling module 9 and the TEC semiconductor refrigerator 103 are arranged in parallel or in a stacked mode; and
a power module 10, configured to drive the liquid cooling module 9 to increase a circulating power when the power of the TEC semiconductor refrigerator 103 is less than a threshold.

The laser 101 of the present disclosure can be cooled by the TEC semiconductor cooler 103, and can also be cooled by the liquid cooling module 9, and the heat dissipation effect of the system is further enhanced through the combination of the liquid cooling module 9 and the TEC semiconductor refrigerator 103. Meanwhile, when the TEC semiconductor refrigerator 103 is abnormal, the liquid cooling module 9 can increase the circulating power so as to ensure that the system always has a good heat radiating effect, and prevent the phenomenon that the normal work is influenced due to the overheating of the entire array of the lasers 101 when the TEC semiconductor refrigerator 103 stops working, so that the entire system has good stability, and the potential safety hazard is reduced.

As shown in FIGS. 1 to 6, the first parameter further includes resistance, resonant frequency, emission wavelength, or threshold current; the second parameter further includes an area of the heat sink 102; the historical operating state data includes resistance, resonant frequency, emission wavelength, threshold current, or operating time of the laser 101;
and/or, the temperature adjusting module 4 includes:
a first determination module 401, configured to determine a predicted temperature rise of the laser 101 within a specific time period based on the predicted temperature;
an acquisition module 402, configured to acquire the number of the predicted temperature rises based on the same TEC semiconductor refrigerator 103 at the same moment;
a second determination module 403 configured to, if there are a plurality of the predicted temperature rises, take a maximum predicted temperature rise as a final predicted temperature rise for adjusting a temperature of the TEC semiconductor refrigerator 103; and if there is one predicted temperature rise, take the predicted temperature rise as a final predicted temperature rise for adjusting a temperature of the TEC semiconductor refrigerator 103; and
an adjusting module 404, configured to control the TEC semiconductor refrigerator 103 to adjust a current temperature of the laser 101 based on a final predicted temperature rise;
and/or, the adjusting module 404 includes:
a first driving module 4041 configured to, when the final predicted temperature rise is in a first temperature rise range, drive the TEC semiconductor refrigerator 103 to work at 25% of the maximum power to restore the temperature of the laser 101;
a second driving module 4042 configured to, when the final predicted temperature rise is in a second temperature rise range, drive the TEC semiconductor refrigerator 103 to work at 50% of the maximum power to restore the temperature of the laser 101;
a third driving module 4043 configured to, when the final predicted temperature rise is in a third temperature rise range, drive the TEC semiconductor refrigerator 103 to work at 75% of the maximum power to restore the temperature of the laser 101; and
a reporting module 4044 configured to, when the final predicted temperature rise exceeds a third temperature rise range, detect a current measured temperature of the laser 101 and acquire current operation state data, and update the measured temperature and the current operation state data to a database.

Embodiment 2

As shown in FIG. 7, an intelligent heat dissipation method applied to the laser packaging system includes:

S1: acquiring a measured temperature of the laser within a specific time period and historical operating state data at a corresponding moment to generate a database, and dividing the database into training data and verification data; training a deep learning model based on the training data, and verifying the trained deep learning model based on the verification data; if a difference between a predicted temperature output by the verification and a corresponding measured temperature is within a first preset interval, outputting the trained deep learning model;

S2: detecting a first parameter and a second parameter of the laser in real time and inputting the first parameter and the second parameter into the trained deep learning model so as to generate a predicted temperature corresponding to the laser; wherein the first parameter includes power, and the second parameter includes running time; and S3: controlling the TEC semiconductor refrigerator to adjust a current temperature of the laser based on a final predicted temperature rise.

According to the present disclosure, the deep learning model is trained, and the first parameter and the second parameter of the laser are input to predict the predicted temperature of the laser, so that the traditional detection of a temperature sensor is replaced, and the entire system is more intelligent. Meanwhile, the heat dissipation effect achieved by the heat dissipation method is good, the laser array module has a good photoelectric conversion rate, and the service life of the laser array module is prolonged.

The intelligent heat dissipation method further includes:
acquiring a measured temperature of the laser at a preset moment;
calculating a difference between the measured temperature of the laser at the preset moment and a predicted temperature according to the measured temperature and the predicted temperature; and
judging whether a difference between the measured temperature and the predicted temperature is in a third preset interval, if a difference between the measured temperature and the predicted temperature exceeds a third preset interval, recording the measured temperature of the laser and working state data at a corresponding moment so as to update a database, and optimizing the deep learning model according to the updated database.

According to the present disclosure, the comparison between the measured temperature and the predicted temperature is adopted to achieve the implementation verification of the trained deep learning model, so that the reliability of the predicted temperature in the system is improved, the deviation between the predicted temperature and the actual temperature is reduced, and the reliability of the entire system is significantly improved.

The "controlling the TEC semiconductor refrigerator to adjust a current temperature of the laser based on the predicted temperature" includes:
determining a predicted temperature rise of the laser within a specific time period based on the predicted temperature;
acquiring the number of the predicted temperature rises based on the same TEC semiconductor refrigerator at the same moment;
if there are a plurality of the predicted temperature rises, taking a maximum predicted temperature rise as a final predicted temperature rise for adjusting a temperature of the TEC semiconductor refrigerator; and if there is one predicted temperature rise, taking the predicted temperature rise as a final predicted temperature rise for adjusting a temperature of the TEC semiconductor refrigerator; and
controlling the TEC semiconductor refrigerator to adjust a current temperature of the laser based on a final predicted temperature rise.

By acquiring a maximum predicted temperature rise on the same TEC semiconductor refrigerator, a final predicted temperature rise of the TEC semiconductor refrigerator temperature is adjusted based on the maximum predicted temperature rise, so that the heat dissipation of the laser can be better ensured, and the reliability and the safety of the system are further improved.

The "controlling the TEC semiconductor refrigerator to adjust a current temperature of the laser based on a final predicted temperature rise" includes:
when the final predicted temperature rise is in a first temperature rise range, driving the TEC semiconductor refrigerator to work at 25% of the maximum power to restore the temperature of the laser;
when the final predicted temperature rise is in a second temperature rise range, driving the TEC semiconductor refrigerator to work at 50% of the maximum power to restore the temperature of the laser;
when the final predicted temperature rise is in a third temperature rise range, driving the TEC semiconductor refrigerator to work at 75% of the maximum power to restore the temperature of the laser; and
when the final predicted temperature rise exceeds a third temperature rise range, detecting a current measured temperature of the laser and acquiring current operation state data, and updating the measured temperature and the current operation state data to a database.

The TEC semiconductor refrigerator is driven to work at different powers by different predicted temperature rises, so that the heat dissipation effect of the entire laser array is better and more uniform. When the predicted temperature rise exceeds a third temperature rise range, the measured temperature of the laser at this moment is detected, working state data is obtained, and the measured temperature and the working state data are updated to a database, so that a deep learning model is optimized according to the updated database.

It should be understood by those skilled in the art that the modules or steps of the present disclosure described above can be implemented by a general-purpose computing device, and can be concentrated on a single computing device or distributed over a network composed of multiple computing devices. Optionally, the modules or steps can alternatively be implemented by program codes executable by a computing device, so that the modules or steps can be stored in a storage device and executed by a computing device; or the modules or steps can be separately made into various integrated circuit modules, or multiple modules or steps thereof can be made into a single integrated circuit module for implementation. Thus, the present disclosure is not limited to any specific combination of hardware and software.

The invention claimed is:

1. A laser packaging system, comprising:
a laser array module, having a plurality of lasers arranged at intervals and distributed in an array, each of the lasers having a heat sink for conducting heat, and each heat sink being provided with a Thermoelectric Cooler (TEC) semiconductor refrigerator for dissipating heat from the laser;

a training module, configured to acquire a measured temperature of the laser within a specific time period and historical operating state data at a corresponding moment to generate a database, and divide the database into training data and verification data; train a deep learning model based on the training data, and verify the trained deep learning model based on the verification data; if a difference between a predicted temperature output by the verification and a corresponding measured temperature is within a first preset interval, output the trained deep learning model;

a prediction module, configured to detect a first parameter and a second parameter of the laser in real time and input the first parameter and the second parameter into the trained deep learning model so as to generate a predicted temperature corresponding to the laser; wherein the first parameter comprises power, and the second parameter comprises a running time; and a temperature adjusting module, configured to control the TEC semiconductor refrigerator to adjust a current temperature of the laser based on the predicted temperature.

2. The laser packaging system according to claim 1, wherein the plurality of lasers comprise a plurality of first lasers and a plurality of second lasers, with at least two second lasers between every two adjacent first lasers;

the system further comprises: a distribution module, configured to determine a measured temperature rise of the laser based on the measured temperature of the laser within a specific time period, if the measured temperature rise exceeds a second preset interval, taking the laser as the first laser, and if the measured temperature rise is in a second preset interval, taking the laser as the second laser.

3. The laser packaging system according to claim 1, further comprising:

a temperature sensor, configured to acquire a measured temperature of the laser at a preset moment;

a calculation module, configured to calculate a difference between the measured temperature of the laser at the preset moment and a predicted temperature according to the measured temperature and the predicted temperature; and an optimization module, configured to judge whether a difference between the measured temperature and the predicted temperature is in a third preset interval, if a difference between the measured temperature and the predicted temperature exceeds a third preset interval, record the measured temperature of the laser and the historical operating state data at a corresponding moment so as to update a database, and optimize the deep learning model according to the updated database.

4. The laser packaging system according to claim 3, wherein a plurality of temperature sensors are provided, and the plurality of temperature sensors are distributed in a distance range from 15% to 80% of a distance from a center to an edge of the laser array module; and the number of the temperature sensors is decreased in a direction from the center to the edge of the laser array module.

5. The laser packaging system according to claim 1, further comprising:

a liquid cooling module, wherein the liquid cooling module is arranged on one side of the laser next to the heat sink, and the liquid cooling module and the TEC semiconductor refrigerator are arranged in parallel or in a stacked mode; and a power module, configured to drive the liquid cooling module to increase a circulating power when the power of the TEC semiconductor refrigerator is less than a threshold.

6. The laser packaging system according to claim 1, wherein the first parameter further comprises resistance, resonant frequency, emission wavelength, or threshold current; the second parameter further comprises an area of the heat sink; the historical operating state data comprises resistance, resonant frequency, emission wavelength, threshold current, or operating time of the laser;

and/or, the temperature adjusting module comprises:

a first determination module, configured to determine a predicted temperature rise of the laser within a specific time period based on the predicted temperature;

an acquisition module, configured to acquire the number of the predicted temperature rises based on the same TEC semiconductor refrigerator at the same moment;

a second determination module configured to, if there are a plurality of the predicted temperature rises, take a maximum predicted temperature rise as a final predicted temperature rise for adjusting a temperature of the TEC semiconductor refrigerator; and if there is one predicted temperature rise, take the predicted temperature rise as a final predicted temperature rise for adjusting a temperature of the TEC semiconductor refrigerator; and an adjusting module, configured to control the TEC semiconductor refrigerator to adjust a current temperature of the laser based on a final predicted temperature rise;

and/or, the adjusting module comprises:

a first driving module configured to, when the final predicted temperature rise is in a first temperature rise range, drive the TEC semiconductor refrigerator to work at 25% of the maximum power to restore the temperature of the laser;

a second driving module configured to, when the final predicted temperature rise is in a second temperature rise range, drive the TEC semiconductor refrigerator to work at 50% of the maximum power to restore the temperature of the laser;

a third driving module configured to, when the final predicted temperature rise is in a third temperature rise range, drive the TEC semiconductor refrigerator to work at 75% of the maximum power to restore the temperature of the laser; and a reporting module configured to, when the final predicted temperature rise exceeds a third temperature rise range, detect a current measured temperature of the laser and acquire current operation state data, and update the measured temperature and the current operation state data to a database.

7. An intelligent heat dissipation method applied to the laser packaging system according to claim 1, comprising:

acquiring the measured temperature of the laser within the specific time period and historical operating state data at the corresponding moment to generate the database, and dividing the database into training data and verification data; training the deep learning model based on the training data, and verifying the trained deep learning model based on the verification data; if the difference between the predicted temperature output by the verification and the corresponding measured temperature is within the first preset interval, outputting the trained deep learning model;

detecting the first parameter and the second parameter of the laser in real time and inputting the first parameter and the second parameter into the trained deep learning model so as to generate the predicted temperature corresponding to the laser; wherein the first parameter comprises power, and the second parameter comprises the running time; and controlling the TEC semiconductor refrigerator to adjust the current temperature of the laser based on the predicted temperature.

8. The method of claim 7, wherein the plurality of lasers comprise a plurality of first lasers and a plurality of second lasers, with at least two second lasers between every two adjacent first lasers;

the system further comprises: a distribution module, configured to determine a measured temperature rise of the laser based on the measured temperature of the laser within a specific time period, if the measured temperature rise exceeds a second preset interval, taking the laser as the first laser, and if the measured temperature rise is in a second preset interval, taking the laser as the second laser.

9. The method of claim 7, further comprising:

a temperature sensor, configured to acquire a measured temperature of the laser at a preset moment;

a calculation module, configured to calculate a difference between the measured temperature of the laser at the preset moment and a predicted temperature according to the measured temperature and the predicted temperature; and an optimization module, configured to judge whether a difference between the measured temperature and the predicted temperature is in a third preset interval, if a difference between the measured temperature and the predicted temperature exceeds a third preset interval, record the measured temperature of the laser and the historical operating state data at a corresponding moment so as to update a database, and optimize the deep learning model according to the updated database.

10. The method of claim 9, wherein a plurality of temperature sensors are provided, and the plurality of temperature sensors are distributed in a distance range from 15% to 80% of a distance from a center to an edge of the laser array module; and the number of the temperature sensors is decreased in a direction from the center to the edge of the laser array module.

11. The method of claim 7, further comprising:

a liquid cooling module, wherein the liquid cooling module is arranged on one side of the laser next to the heat sink, and the liquid cooling module and the TEC semiconductor refrigerator are arranged in parallel or in a stacked mode; and a power module, configured to drive the liquid cooling module to increase a circulating power when the power of the TEC semiconductor refrigerator is less than a threshold.

12. The method of claim 7, wherein the first parameter further comprises resistance, resonant frequency, emission wavelength, or threshold current; the second parameter further comprises an area of the heat sink; the historical operating state data comprises resistance, resonant frequency, emission wavelength, threshold current, or operating time of the laser;

and/or, the temperature adjusting module comprises:

a first determination module, configured to determine a predicted temperature rise of the laser within a specific time period based on the predicted temperature;

an acquisition module, configured to acquire the number of the predicted temperature rises based on the same TEC semiconductor refrigerator at the same moment;

a second determination module configured to, if there are a plurality of the predicted temperature rises, take a maximum predicted temperature rise as a final predicted temperature rise for adjusting a temperature of the TEC semiconductor refrigerator; and if there is one predicted temperature rise, take the predicted temperature rise as a final predicted temperature rise for adjusting a temperature of the TEC semiconductor refrigerator; and an adjusting module, configured to control the TEC semiconductor refrigerator to adjust a current temperature of the laser based on a final predicted temperature rise;

and/or, the adjusting module comprises:

a first driving module configured to, when the final predicted temperature rise is in a first temperature rise range, drive the TEC semiconductor refrigerator to work at 25% of the maximum power to restore the temperature of the laser;

a second driving module configured to, when the final predicted temperature rise is in a second temperature rise range, drive the TEC semiconductor refrigerator to work at 50% of the maximum power to restore the temperature of the laser;

a third driving module configured to, when the final predicted temperature rise is in a third temperature rise range, drive the TEC semiconductor refrigerator to work at 75% of the maximum power to restore the temperature of the laser; and a reporting module configured to, when the final predicted temperature rise exceeds a third temperature rise range, detect a current measured temperature of the laser and acquire current operation state data, and update the measured temperature and the current operation state data to a database.

* * * * *